United States Patent
Yamada

(10) Patent No.: US 7,506,279 B2
(45) Date of Patent: Mar. 17, 2009

(54) DESIGN SUPPORTING APPARATUS CAPABLE OF CHECKING FUNCTIONAL DESCRIPTION OF LARGE-SCALE INTEGRATED CIRCUIT TO DETECT FAULT IN SAID CIRCUIT

(75) Inventor: Takamitsu Yamada, Kanagawa (JP)

(73) Assignee: Ricoh Company, Ltd, Tokyo (JP)

( * ) Notice: Subject to any disclaimer, the term of this patent is extended or adjusted under 35 U.S.C. 154(b) by 391 days.

(21) Appl. No.: 10/921,455

(22) Filed: Aug. 19, 2004

(65) Prior Publication Data

US 2005/0055612 A1 Mar. 10, 2005

(30) Foreign Application Priority Data

Aug. 22, 2003 (JP) .............................. 2003-298291

(51) Int. Cl.
*G06F 9/45* (2006.01)
*G06F 17/50* (2006.01)
*G06F 9/44* (2006.01)

(52) U.S. Cl. .................. 716/4; 716/1; 716/5; 716/18; 717/143; 717/144

(58) Field of Classification Search .............. 716/4, 716/7, 18; 717/143
See application file for complete search history.

(56) References Cited

U.S. PATENT DOCUMENTS

| | | | |
|---|---|---|---|
| 5,282,150 A | | 1/1994 | Yamada |
| 5,388,058 A | | 2/1995 | Yamada |
| 5,572,437 A | * | 11/1996 | Rostoker et al. ............... 716/18 |
| 5,572,712 A | * | 11/1996 | Jamal ............................ 716/18 |
| 5,613,117 A | * | 3/1997 | Davidson et al. ............. 717/144 |
| 5,867,395 A | * | 2/1999 | Watkins et al. ................ 716/18 |
| 5,907,709 A | * | 5/1999 | Cantey et al. ................ 717/141 |
| 5,937,190 A | * | 8/1999 | Gregory et al. .............. 717/131 |
| 6,061,811 A | * | 5/2000 | Bondi et al. ................... 714/30 |
| 6,070,261 A | | 5/2000 | Tamarapalli et al. |
| 6,132,109 A | * | 10/2000 | Gregory et al. .............. 717/131 |
| 6,169,968 B1 | * | 1/2001 | Kabuo .......................... 703/14 |
| 6,173,435 B1 | * | 1/2001 | Dupenloup .................. 716/18 |
| 6,175,948 B1 | * | 1/2001 | Miller et al. .................... 716/7 |
| 6,256,770 B1 | * | 7/2001 | Pierce et al. ................... 716/18 |
| 6,505,328 B1 | * | 1/2003 | Van Ginneken et al. ........ 716/7 |
| 6,618,839 B1 | * | 9/2003 | Beardslee et al. .............. 716/4 |
| 6,760,888 B2 | * | 7/2004 | Killian et al. ................... 716/1 |
| 6,823,497 B2 | * | 11/2004 | Schubert et al. ................ 716/4 |

(Continued)

FOREIGN PATENT DOCUMENTS

JP 5-241882 9/1993

(Continued)

*Primary Examiner*—Helen Rossoshek
(74) *Attorney, Agent, or Firm*—Cooper & Dunham

(57) ABSTRACT

A design supporting apparatus is disclosed, including: an inputting part; a syntactic analyzing part; and a scanning and searching part. The inputting part inputs functional description data of a register transfer level. The syntactic analyzing part conducts a syntactic analysis for the functional description data and develops a parse tree. The scanning and searching part scans and searches for the parse tree being developed by the syntactic analyzing part and searches for a description representing a comparison operator having multiple bits, the comparison operator being difficult to detect a fault by test data formed by pseudo-random numbers, which are applied from a pseudo-random number generator of a logic built-in self-test.

10 Claims, 10 Drawing Sheets

U.S. PATENT DOCUMENTS

| | | | |
|---|---|---|---|
| 6,885,983 B1 * | 4/2005 | Ho et al. | 703/14 |
| 7,000,213 B2 * | 2/2006 | Banerjee et al. | 716/18 |
| 7,007,249 B2 * | 2/2006 | Ly et al. | 716/4 |
| 7,080,365 B2 * | 7/2006 | Broughton et al. | 717/146 |
| 7,093,231 B2 * | 8/2006 | Nuss | 717/114 |
| 7,103,859 B2 * | 9/2006 | Yamada | 716/4 |
| 7,107,569 B2 * | 9/2006 | Ito | 716/18 |
| 7,240,303 B1 * | 7/2007 | Schubert et al. | 716/4 |
| 7,243,087 B2 * | 7/2007 | Iyer | 706/46 |
| 2002/0162087 A1 | 10/2002 | Minami et al. | |
| 2003/0033595 A1 * | 2/2003 | Takagi et al. | 717/143 |
| 2003/0149915 A1 | 8/2003 | Yamada | |
| 2004/0034815 A1 | 2/2004 | Yamada | |
| 2006/0218512 A1 * | 9/2006 | Arslan et al. | 716/4 |

FOREIGN PATENT DOCUMENTS

| | | |
|---|---|---|
| JP | 6-259496 | 9/1994 |
| JP | 2711492 | 10/1997 |
| JP | 11-85828 | 3/1999 |
| JP | 2000-215225 | 8/2000 |
| JP | 2001-251356 | 9/2001 |
| JP | 2004102703 A * | 4/2004 |

* cited by examiner

FIG.1
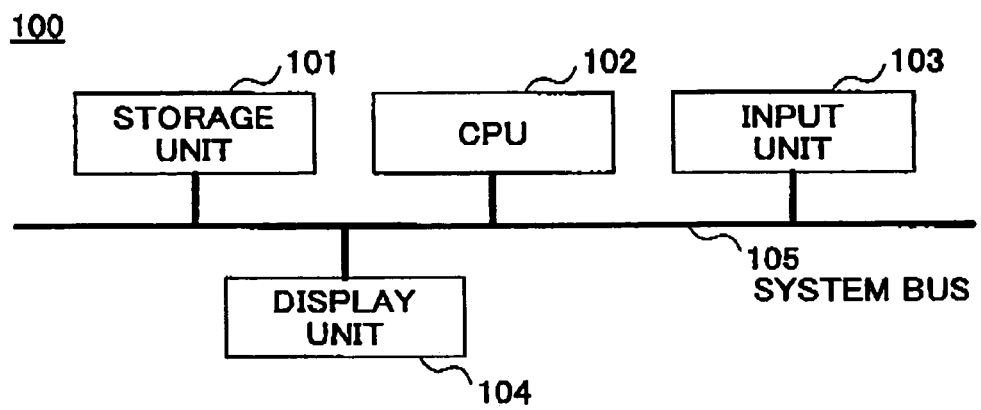
FIG.2A
q = a + b ;
FIG.2B
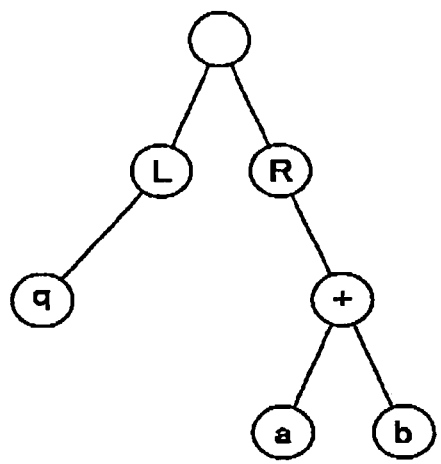
FIG.2C
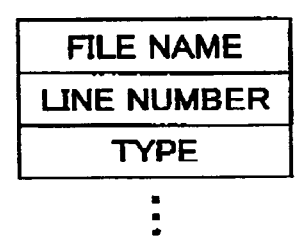

```
if (a > b)
    q = a + b ;
else
    q = q ;
```

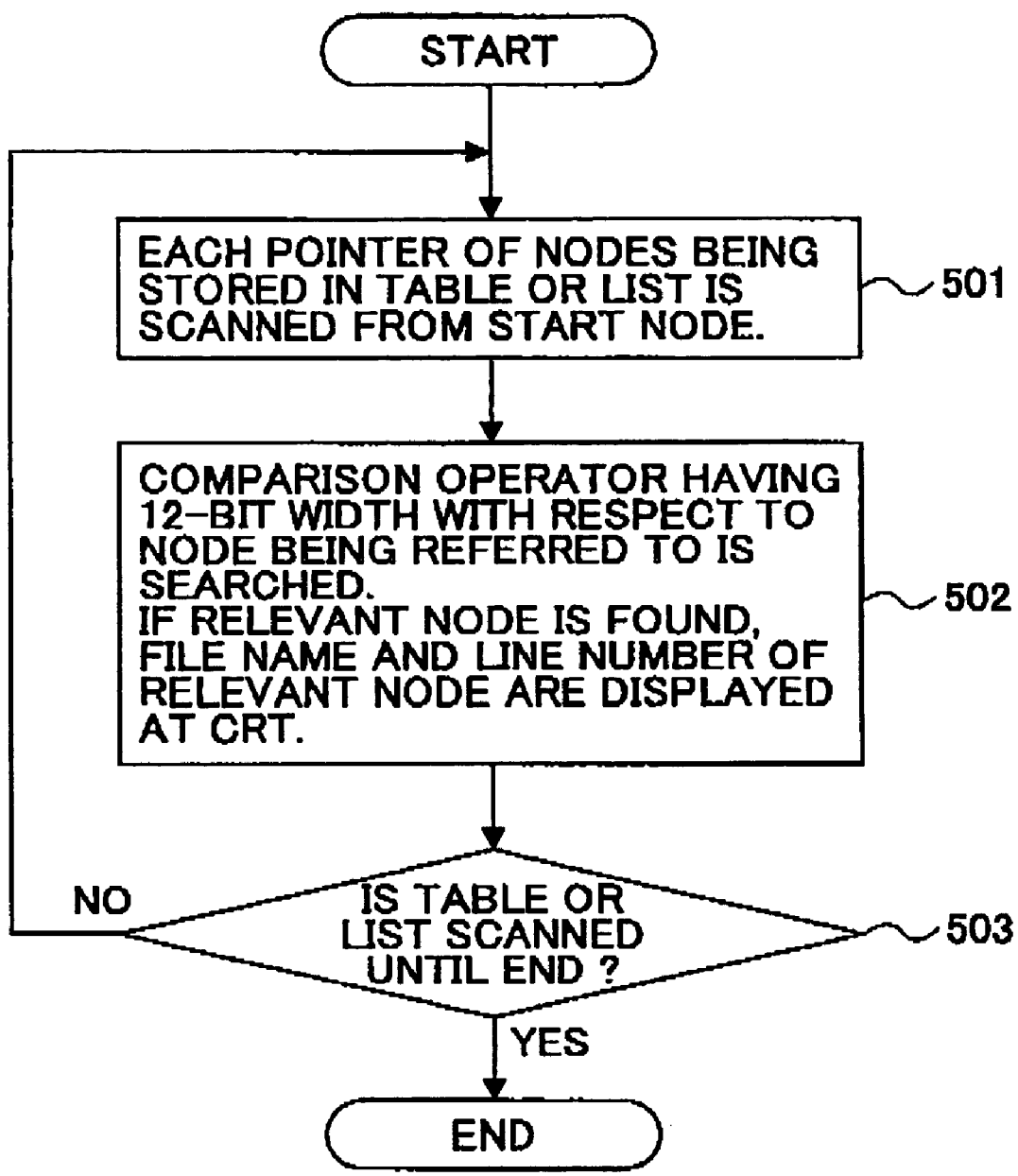

```
1  typedef struct node {
2      char*       FileName;
3      int         LineNumber;
4      int         Type;
5      int         OpeType;
6      struct node* next;
7      Set         sub;
8  } NODE*;
9
10 void    search ( parent)
11 NODE*   parent;
12 {
13     NODE*   v;
14
15     while ( v = get_node( parent)) {
16         if ( v->Type = Operator) {
17             if ( v->OpeType = EqOp | v->OpeType = GtOp | v->OpeType = LtOp ) {
18                 if ( get_operand_bit_width( v) > 12) {
19                     show ( v=>FileName, v=>LineNumber);
20                 }
21             } else {
22                 search( v=>SubNode)
23             }
24         }
25     }
26 }
27
28 void    scan()
29 {
30     NODE*   v;
31
32     for ( v = head; v != NULL; v->next) {
33         search( parent);
34     }
35 }
```

```
1   void    search_if_else ( parent)
2   NODE*   parent;
3   {
4       NODE*       v;
5       NODE*       u;
6       NODE*       next;
7       Int         i = 0;
8
9       while ( v = get_node( parent)) {
10          if ( v->Type = IfElse) {
11              next = v;
12              while ( u = get_node( next)) {
13                  if ( u->Type = IfElse) {
14                      i++;
15                      next = u;
16                      continue;
17                  } else {
18                      break;
19                  }
20              }
21              if ( i > 3) {
22                  show( v->FileName, v->LineNumber);
23              }
24          }
25      }
26      return ;
27  }
```

FIG.10

```
                          1001                    1002
rule1 : if ( OpType = EqOp and BitWidth > 12) detected;
 rule2 : if ( OpType = MultOp and BitWidth > 32) detected;
1003
```

FIG.11

TABLE (1)

| | | | |
|---|---|---|---|
| #define SubOp | 1 | /* binary subtraction */ |
| #define DivOp | 2 | /* binary division */ |
| #define ModOp | 3 | /* binary modulus */ |
| #define EqOp | 4 | /* binary equality */ |
| #define NeqOp | 5 | /* binary inequality */ |
| #define CaseEqOp | 6 | /* case (x and z) equality */ |
| #define CaseNeqOp | 7 | /* case inequality */ |
| #define GtOp | 8 | /* binary greater than */ |
| #define GeOp | 9 | /* binary greater than or equal */ |
| #define LtOp | 10 | /* binary less than */ |
| #define LeOp | 11 | /* binary less than or equal */ |
| #define LShiftOp | 12 | /* binary left shift */ |
| #define RShiftOp | 13 | /* binary right shift */ |
| #define AddOp | 14 | /* binary addition */ |
| #define MultOp | 15 | /* binary multiplication */ |

TABLE (2)

| | |
|---|---|
| #define Reg | 1 |
| #define Net | 2 |
| #define Port | 3 |

TABLE (3)

| | |
|---|---|
| #define Operator | 1 |
| #define Variable | 2 |
| #define IfElse | 3 |
| #define Case | 4 |

DESIGN SUPPORTING APPARATUS CAPABLE OF CHECKING FUNCTIONAL DESCRIPTION OF LARGE-SCALE INTEGRATED CIRCUIT TO DETECT FAULT IN SAID CIRCUIT

BACKGROUND OF THE INVENTION

1. Field of the Invention

The present invention generally relates to design supporting apparatuses being applicable to an analysis system or a design system and easily conducting a test, and more particularly to a design supporting apparatus capable of confirming a description of which a fault in a hardware functional description is difficult to be detected which is independent of an architecture when a large-scale integrated (LSI) circuit is tested by a function of a logic built-in self-test.

2. Description of the Related Art

For example, a conventional technology of a built-in self-test method (hereinafter, called logic BIST) of a scan-base using a random number for test data is disclosed in a Japanese Laid-open Patent Application No. 5-241882 and a Japanese Patent No. 2711492. Moreover, for example, a checking method for a functional description of a register transfer level is disclosed in Japanese Laid-open Patent Applications No. 11-85828, No. 2000-215225, and No 6-259496.

First, the Japanese Laid-open Patent Application No. 5-241882 describes advantages and disadvantages of a BIST circuit design having the function of the built-in self-test in an architecture. As the advantages, since a manufacturer is not required to cover time and cost necessary to embed a special test device in order to check a function and an operation of a circuit under test, test efficiency is improved. In addition, as the disadvantages, since it is required to assign a physical area within an IC (Integrated Circuit), an area for regular functional components is required to be smaller.

A circuit in the Japanese Laid-open Patent Application No. 5-241882 functions as a built-in self-test circuit (BIST) to test an operation of a circuit under test by generating a test vector and accumulating signals being output from the circuit under test in response to a test vector. A linear feedback shift register (LFSR) includes a first input being coupled to receive a signal output from the circuit under test, and an output to send a test vector to the circuit under test.

Next, the Japanese Patent No. 2711492 describes a distributed built-in self-test circuit for conducting a built-in self-test of a chip in a diagnostic test of an LSI design and a quality test at an LSI production, and more particularly to a pattern compressing device for the built-in self-test. That is, for the built-in self-test with respect to the LSI, it is required to arrange a pattern compressor for each of various functional blocks. Accordingly, because hardware of the built-in self-test is additionally arranged, a chip area is increased and a yield of the LSI is degraded. Therefore, an amount of hardware is required to be reduced as much as possible. As a spatial compressor built-in each functional block, various compressors having different configurations such as a compressor using a multiple input linear feedback shift register, a compressor using an exclusive OR, and a like are combined in sequence based on a smaller amount of hardware.

For example, the technologies described in the Japanese Laid-open Patent Applications No. 11-85828 and No. 6-259496 are related to a supporting apparatus to improve a test quality by a test bench that is created by a user, which warns a state coverage and an inactive state of a sequential circuit from a simulation result using the test bench created by the user.

Moreover, the Japanese Laid-open Patent Application No. 2000-215225 discloses a technology to examine data propagation from an input to an output based on a simulation result by a test bench created by a user, and to verify a test simplification.

Since test data are pseudo-random numbers in the logic BIST, there are cases in which a sufficient fault detection ratio cannot be obtained. In particular, a comparison operator including multiple bits is a circuit (random resistant) in which a fault detection using a pseudo-random number is not easily conducted. Regarding a circuit having an encoder and a conditional branch process being nested, if test data are pseudo-random numbers, a bias occurs after a conditional branch. As a result, there are circuits which remain without being tested.

Conventionally, in response to these problems, a technology is disclosed in U.S. Pat. No. 6,070,261 to insert a test circuit at a place where a controllability and an observability in a net list of gate levels are not good.

However, in this technology, because of the test circuit being inserted, a circuit function, especially, speed is degraded. In addition, in a case of a large-scale circuit, an execution time becomes longer in an analysis tool for the controllability and the observability.

In order to solve the above-described problems, for example, a description being difficult to detect a fault by the logic BIST is extracted at a register transfer level (hereinafter, called RTL), and a test circuit description is additionally described to the description being extracted. A net list of the gate level, in which a countermeasure is taken for the above-described problems, can be obtained.

However, it is required to know a description corresponding to a random resistance in the RTL beforehand.

Furthermore, in other than the test, an equivalence checking tool is not used for a multiplier having more than 32 bits in an equivalence checking process. Regarding the logic synthesis, if the multiplier is a large-scale circuit, the execution time becomes longer. In response to this problem, it is required to divide the description. In this case, it is needed to know where a problem is in the RTL beforehand.

SUMMARY OF THE INVENTION

It is a general object of the present invention to provide a design supporting apparatus in which the above-mentioned problems are eliminated.

A more specific object of the present invention is to provide the design supporting apparatus which improves a test quality in that test data are random numbers in a test method of a scan base, and can specify and extract a portion degrading the test quality, statically without using a simulator.

The above objects of the present invention are achieved by a design supporting apparatus, including: an inputting part inputting functional description data of a register transfer level; a syntactic analyzing part conducting a syntactic analysis for the functional description data and developing a parse tree; and a scanning and searching part scanning and searching for the parse tree being developed by the syntactic analyzing part and searching for a description representing a comparison operator having multiple bits, the comparison operator being difficult to detect a fault by test data formed by pseudo-random numbers, which are applied from a pseudo-random number generator of a logic built-in self-test.

Moreover, the above objects of the present invention are achieved by a design supporting apparatus, including: an inputting part inputting functional description data of a register transfer level; a syntactic analyzing part conducting a syntactic analysis of the functional description data and developing a parse tree; a knowledge-based library in that the parse tree being developed by the syntactic analyzing part is possible to be scanned and searched for and description forms to be searched is stored in a rule form; and a searching part searching a relevant description form by referring to the knowledge-based library.

BRIEF DESCRIPTION OF THE DRAWINGS

In the following, embodiments of the present invention will be described with reference to the accompanying drawings.

FIG. 1 is a diagram showing a hardware configuration of a design supporting apparatus according to a first embodiment of the present invention;

FIG. 2A is a diagram showing an example of the functional description data of the RTL according to the first embodiment of the present invention, FIG. 2B is a diagram showing an example of the parse tree that is developed in the storage unit from a description of the RTL by the syntactic analysis according to the first embodiment of the present invention, and FIG. 2C is a diagram showing information which is stored in a structure form for each node of the parse tree according to the first embodiment of the present invention;

FIG. 5 is a flowchart for explaining a series of processes for searching a comparison operator description having more than 12 bits as the searching process according to the first embodiment of the present invention;

FIG. 6 is a diagram showing an example of a description in a program form of the C programming language, according to the first embodiment of the present invention;

FIG. 8 is a diagram showing an example of a description for searching for more than three branches after a conditional branch of "If-Else", according to the variation of the first embodiment of the present invention;

FIG. 10 is a diagram showing a rule for searching for a comparison operator having more than 12 bits as an example of the knowledge-based library in FIG. 9, according to the second embodiment of the present invention; and FIG. 11 is a diagram illustrating assignments of an identifier concerning a type of the operator, according to the second embodiment of the present invention.

DESCRIPTION OF THE PREFERRED EMBODIMENTS

Figure 3:
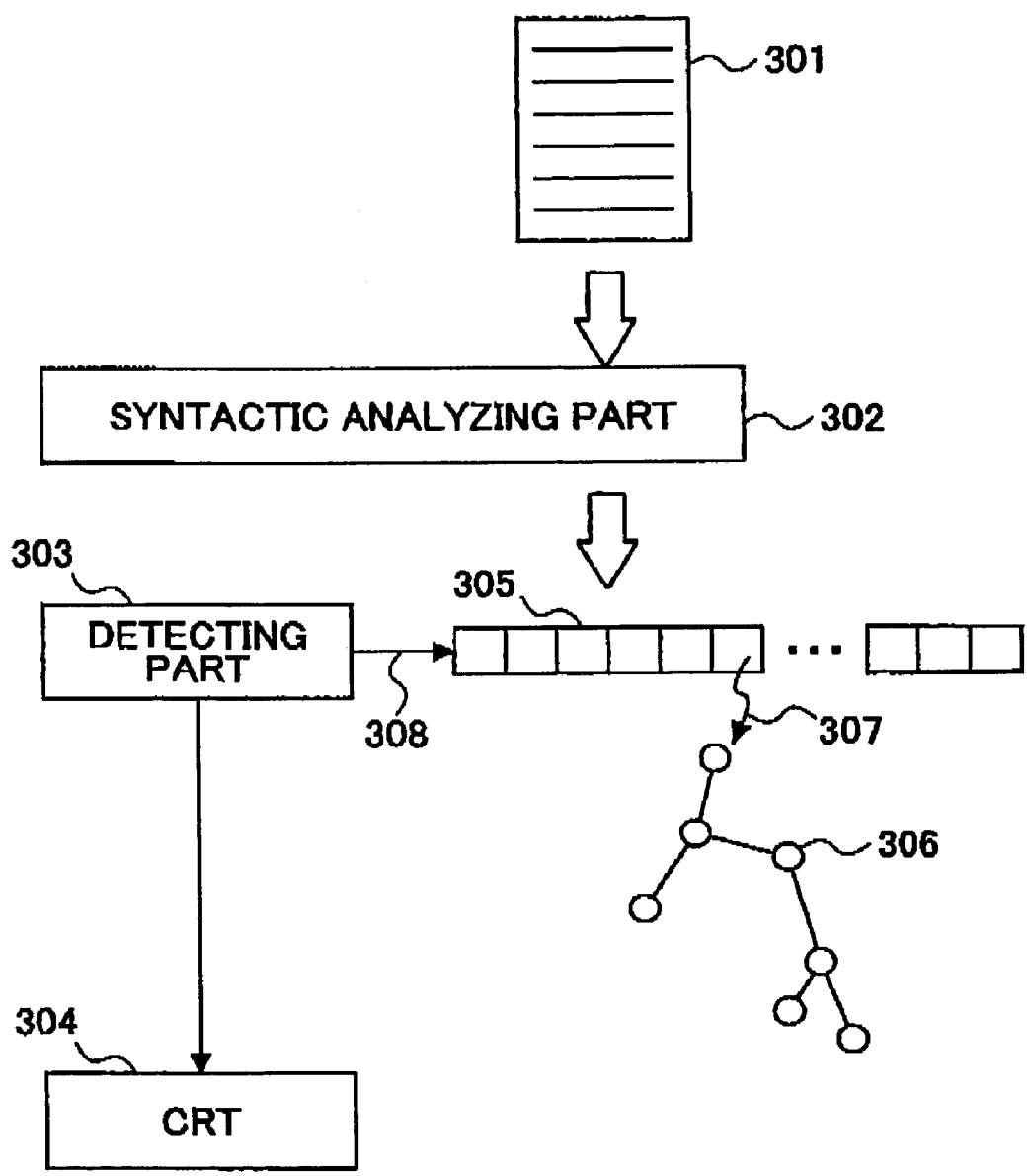
FIG. 3 is a diagram for explaining a state of the design supporting apparatus according to the first embodiment of the present invention.

In the following, embodiments of the present invention will be described with reference to the accompanying drawings.

First Embodiment

FIG. 1 is a diagram showing a hardware configuration of a design supporting apparatus according to a first embodiment of the present invention.

In FIG. 1, a storage unit 101 is a memory or a hard disk to store functional description data of a resister transfer level (RTL) and a program realizing each of processing parts of the design supporting apparatus 100. A CPU (Computer Processing Unit) 102 controls the entire design supporting apparatus 100. An input unit 103 is a keyboard or a mouse to input and edit a hardware functional description being independent of an architecture and to interactively input an executive instruction of the program of each of processing parts in the design supporting apparatus 100 according to the present invention.

A display unit 104 is a CRT (Cathode Ray Tube) to display the hardware functional description being independent of the architecture and display an execution progress and an execution result of the program of each of processing parts according to the present invention. A system bus 105 is an interface (I/F) for each of units 101, 102, 103, and 104.

After the CPU 102 conducts a syntactic analysis with respect to the functional description data of the RTL, a parse tree is developed and stored in the storage unit 101 such as the memory or the hard disk.

The functional description data of the RTL and the parse tree will be described with FIG. 2A, FIG. 2B, and FIG. 2C.

FIG. 2A is a diagram showing an example of the functional description data of the RTL according to the first embodiment of the present invention, FIG. 2B is a diagram showing an example of the parse tree that is developed in the storage unit from a description of the RTL by the syntactic analysis according to the first embodiment of the present invention, and FIG. 2C is a diagram showing information which is stored in a structure form for each node of the parse tree according to the first embodiment of the present invention.

Each node of the parse tree stores an operand and an operator of a variable. The operand corresponds to a register or a net. The operator corresponds to a type of an operation such as an addition, a subtraction, a multiplication, a comparison, or a like. In FIG. 2B, a node denoting "L" is a top node of the parse tree concerning a left side of an arithmetic expression in description data and a node denoting "R" is a top node of the parse tree concerning a right side of an arithmetic expression in the description data.

In a structure in FIG. 2C, for example, "FILE NAME" is an array of a char type of C programming language and stores a file name of the functional description data of the RTL. "LINE NUMBER" stores a line number in an integer type. "TYPE" stores an identifier such as a type of the operator, a type of the register, a type of the net, a type of a port, or the like.

In FIG. 11, a table (1) shows an example of an assignment of the identifier concerning the type of the operator.

In the table (1) in FIG. 11, "SubOp" represents "−" (subtraction) operation, "DivOp" represents "/" (division) operation, "AddOp" represents "=" (addition) operation, and "MultOp" represents "*" (multiplication) operation. In a case in that the type of the node is the register, the net, or the port, information concerning a bit width is stored in the structure in FIG. 2C.

In a case in that there are a plurality of operational expressions and conditional branch processes in the functional description data of the RTL to input, the parse tree is created for each operation, and a top node of each parse tree is stored in a list form or a hash table form on the memory. In this case, the parse trees can be browsed and referred to by scanning the memory.

FIG. 3 is a diagram for explaining a state of the design supporting apparatus according to the first embodiment of the present invention.

That is, FIG. 3 shows states of components, the functional description data of the RTL, and the parse tree being developed in the storage unit 101 such as the memory or the hard disk by the syntactic analysis, and a state of storing the parse tree to a table so as to be possible to scan, search, and browse the parse tree.

A functional description data 301 is a functional description data of the RTL to input, a syntactic analyzing part 302 is a processing part for conducing the syntactic analysis according to the present invention, a detecting part 303 is a processing part for detecting the parse tree, a CRT 304 displays a detection result, a table 305 is a table provided by the detecting part 303 to be possible to scan, search, and brows the parse tree, the parse tree 306 is a parse tree being developed by conducting the syntactic analysis for the operation expression and the conditional branch process in the functional description data 301, a pointer 307 is a pointer possible to refer to the parse tree 306 from the table 305, and a pointer 308 is pointer possible to refer to the table 305 from the detecting part 303. The table 305 may be configured as a list structure.

A process flow in the functional description data 301 of the RTL is also stored in a form of the parse tree 306.

Figures 4A, 4B:
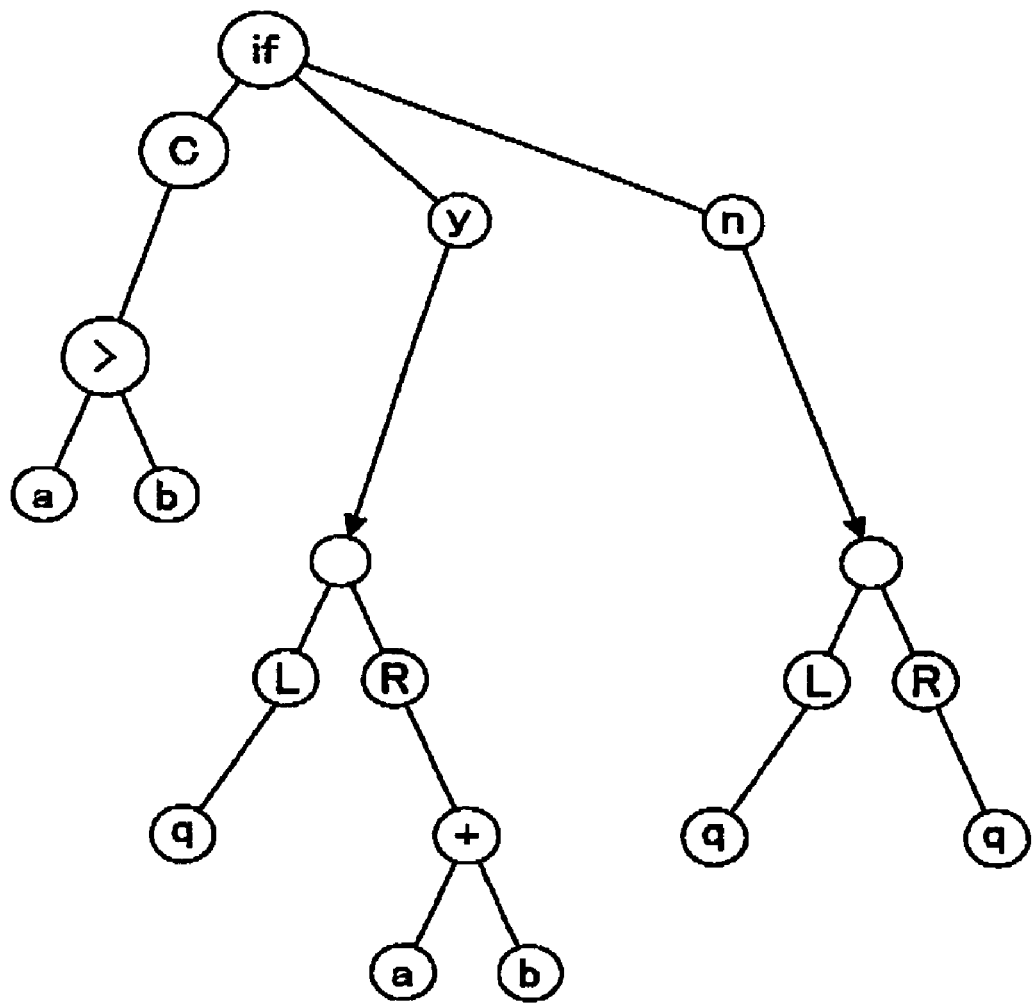
FIG. 4A and FIG. 4B are diagrams illustrating the parse tree in which a process flow description is developed, according to the first embodiment of the present invention.

The process flow corresponds to a case statement of a Verilog HDL (Hardware Description Language) or a conditional branch description in an if_els form FIG. 4A and FIG. 4B are diagrams illustrating the parse tree in which a process flow description is developed, according to the first embodiment of the present invention.

In FIG. 4A, an example of the if_els form is shown. In FIG. 4B, "C" denotes a conditional expression, that is, a node for storing a pointer to refer to the parse tree concerning the conditional expression, and the conditional expression configures the parse tree. In FIG. 4B, "y" denotes a node for storing a pointer to refer to the parse tree concerning an operation that is executed when a condition is true and "n" denotes a node for storing a pointer to refer to the parse tree concerning an operation that is executed when a condition is false. Each operation to be executed configures the parse tree. These parse trees are stored in the list form or the hash table form and can be scanned for reference and to browse.

In the present invention, in the above-described configuration, it is possible to scan, browse, and refer to the parse tree being developed in the storage unit 101 such as the memory or the hard disk. Accordingly, description forms described in the functional description data of the RTL can be confirmed and analyzed. According to a passed technical report, the comparison operator having multiple bits is a circuit (random resistant) being difficult to detect a fault by a pseudo-random number. Regarding a circuit having the encoder and the nested conditional branch process, in a case in which the test data are pseudo-random numbers, a bias occurs after the conditional branch. As a result, there are circuits which remain without being tested.

However, in the first embodiment, by scanning, browsing, and referring to the parse tree, for example, a node for the comparison operator is searched for and a register as an operand and the bit width of the net is further referred to. If a result shows a comparison operator having more than 12 bits, the file name and the line number of the functional description data 301 of the RTL are displayed at the CRT 304.

FIG. 5 is a flowchart for explaining a series of processes for searching a comparison operator description having more than 12 bits as the searching process according to the first embodiment of the present invention. FIG. 6 is a diagram showing an example of a description in a program form of the C programming language, according to the first embodiment of the present invention.

When a search begins, each pointer of nodes being stored in a table or a list is scanned from a start node (step 501), and a comparison operator having a 12-bit width with respect to a node being referred to is searched. If a relevant node is found, the file name and the line number of the relevant node are displayed at the CRT (step 502). When the table or the list is scanned until the end thereof (step 503), the scanning process is terminated.

Lines 1-7 in FIG. 6 shows a structure for string information which each node in the node tree holds. "FileName" and "LineNumber" store a file name and a line number of the functional description data of the RTL, "Type" stores an identifier for distinguish types of the operation, the register, the port, and the net, "OpeType" stores an identifier of the operator, "next" stores a pointer of a next node so that it is possible to scan the parse tree in the table of the list structure, and "sub" stores a set of pointers to refer to a node of a sub tree from another sub tree in the parse tree.

Lines 32-34 in FIG. 6 are for a looping process including the steps 501 and 502 in FIG. 5 to scan the parse tree in the table or the list.

A "search" function described in lines 10-26 in FIG. 6 conducts a process of the step S502 in FIG. 5. An argument "parent" receives a top node of the parse tree, and the parse tree is searched by a while statement in lines 15-25. A "get_node" function in line 15 is used to choose one node from the set of sub trees, and all sub trees are scanned by awhile process. A process described in lines 17-20 displays the file name and the line number if the node is an operator and the comparison operator, and the bit width of the node is more than 12 bits. "EqOp", "GtOp", and "LtOp" in line 17 are identifiers of the comparison operators: equal, greater than, and less than. A "get_operand_bit_width" function in line 18 returns the bit width of the register, the port, or the net of the operand by referring to the sub tree of the node "v". In addition, a "shpw" function displays the file name and the line number for a description corresponding to the node at the CRT.

In this search process, the "search" function is recursively called, so that the parse tree is searched until the end node.

A table (3) in FIG. 11 shows an identifier for distinguishing a type of the operator, the register, the port, and the net, which is stored in "Type" described above.

"Operator" in the table (3) shows that the node is the operator, and "Variable" shows any one of the register, the port, and the net. In addition, "ifElse" shows that the node is a "If-Else" type and "Case" shows that the node is a conditional branch of a case branch type.

Figure 7:
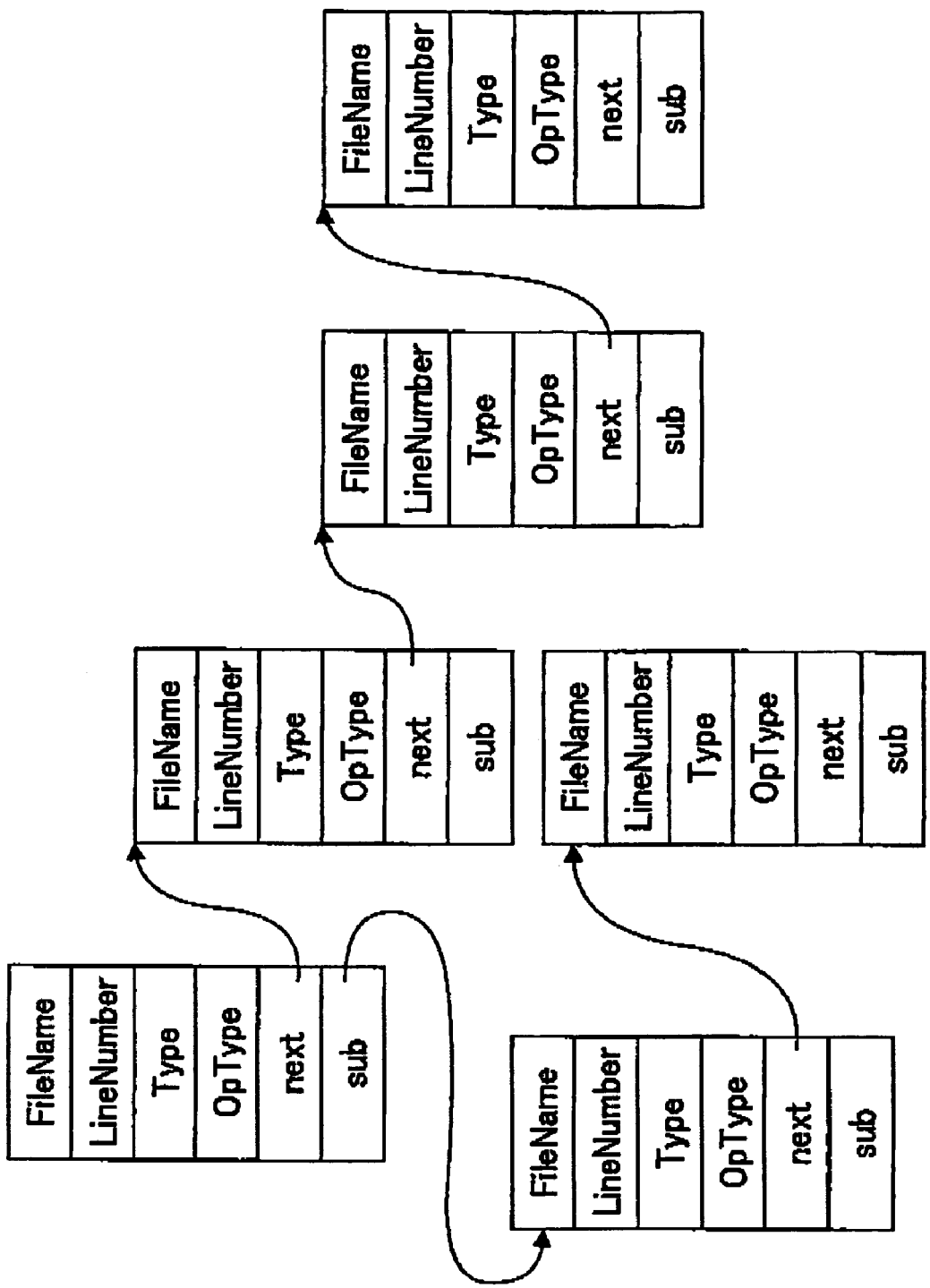
FIG. 7 is a diagram illustrating a list structure possible to scan by the "next" which refers to a pointer, according to the first embodiment of the present invention.

FIG. 7 is a diagram illustrating a list structure possible to scan by the "next" which refers to a pointer, according to the first embodiment of the present invention The set of sub trees is of storing the nodes of the sub tress in the list structure.

[Variation of First Embodiment]

In the first embodiment, the multiplication operator is conducted by 12 bits. In a variation of the first embodiment, a case of searching for the multiplication operator being conducted by more than 32 bits will be described. In this case, "MultOp" is set to compare with "OpType" in line 17 in FIG. 6 and a bit width comparison in line 18 in FIG. 6 is set to "32".

FIG. 8 is a diagram showing an example of a description for searching for more than three branches after a conditional branch of "If-Else", according to the variation of the first embodiment of the present invention.

Instead of the "search" function, "search_if_else" function is conducted. In line 10, it is checked whether or not the node is a node to conduct the conditional branch of "If-Else". When the node conducts the conditional branch of "If-Else", a looping process in lines 12-20 searches for a tree of "If_Else" and counts a depth of the parse tree by incrementing "i" by one. As a result, when "i" is more than three or equal to three, the file name and the line number are displayed at the CRT.

Second Embodiment

Figure 9:
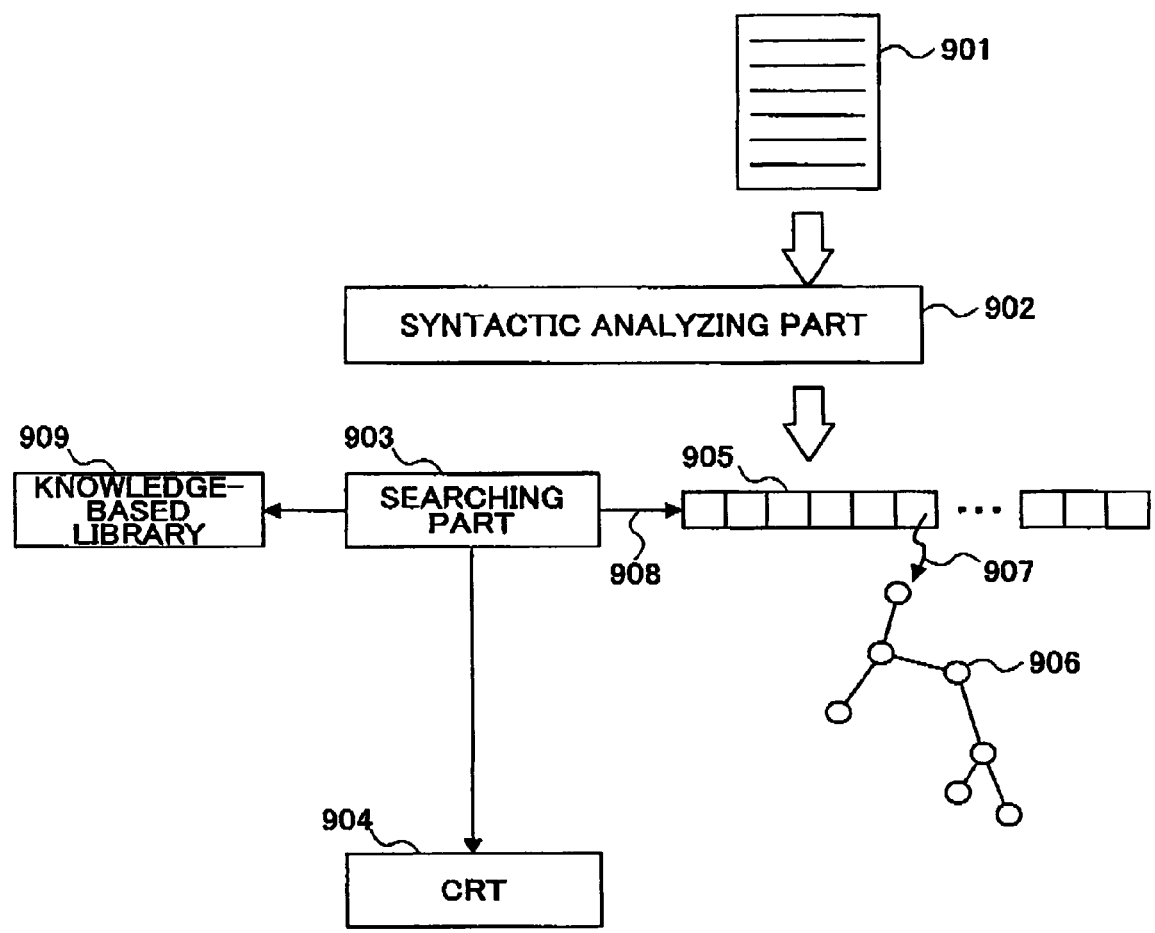
FIG. 9 is a diagram showing a configuration of a design supporting apparatus according to a second embodiment of the present invention.

FIG. 9 is a diagram showing a configuration of a design supporting apparatus according to a second embodiment of the present invention.

In FIG. 9, the functional description data of the RTL being input and the parse tree being stored in the memory or the hard disk are illustrated. In FIG. 9, a knowledge-based library 909 is configured by a rule of "If_Then". A searching part 903 conducts a searching process in accordance with the rule of the knowledge-based library 909.

In FIG. 9, a functional description data 901 is a functional description data of the RTL to input, a syntactic analyzing part 902 is a processing part for conducing the syntactic analysis according to the present invention, a CRT 904 displays a detection result, a table 905 is a table provided by the searching part 903 to be possible to scan, search, and browse the parse tree, the parse tree 906 is a parse tree being developed by conducting the syntactic analysis for the operation expression and the conditional branch process in the functional description data 901, a pointer 907 is a pointer possible to refer to the parse tree 906 from the table 905, and a pointer 908 is a pointer possible to refer to the table 905 from the searching part 903. The table 905 may be configured as a list structure.

FIG. 10 is a diagram showing a rule for searching for a comparison operator having more than 12 bits as an example of the knowledge-based library in FIG. 9.

A description 1001 indicates that an operator to search is "EqOp", and a description. 1002 indicates that the bit width is greater than and equal to 12 bits. When the searching part 903 refers to this, the searching part 903 conducts "EqOp" of the description 1001 as a condition of an operator matching in line 17 in FIG. 6, and further conducts a condition showing more than 12 bits in the description 1002 as a comparison value of the 12-bit width in line 18 in FIG. 6.

A description 1003 in FIG. 10 shows a rule description ruling the multiplication being more than 32 bits.

As described above, in the present invention, since the RTL is developed as the parse tree in the memory or the hard disk, it is possible to scan and search for an operation and a condition description. Accordingly, it is possible to search for each node of a large-scale comparison operator occurring a fault at a test and each node of a large-scale multiplication circuit occurring a fault at the test when the equivalence checking or the logic synthesis is conducted, and it is possible to warn a relevant description portion by the file name and the line number. As a result, it is possible to warn a modification concerning a description of the RTL, which occurs a fault at the test, the equivalence checking, and the logic synthesis, and it is possible to contend with the modification at an earlier stage of the design.

In addition, since description forms to be searched is maintained as the knowledge-based library, it is possible to delete a rule concerning a description form, which has been already overcome, accompanying with an increase of an amount of the description forms being maintained. Therefore, a check specifying any one of the test, the equivalence checking, and the logic synthesis can be realized.

In the design supporting apparatus according to the present invention, it is possible to test whether or not a RTL description style, which is experientially known as random resistant, is written in a RTL created by a user. If the RTL description style is written, it is possible to warn this result so as to support a design work of a test simplification for the logic BIST.

Moreover, by this warning, the user (LSI designer or circuit designer) can easily recognize a description portion being warned Thus, the user can take a step of a TPI (Test Protocol Input) with respect to a relative block or properly improve a timing by a logic compression after the TPI. Accordingly, it is possible to suppress a length of a development term.

In other than the test, it is possible to prompt the user (LSI designer or circuit designer) by confirming and warning the large-scale multiplier, which cause a problem by the equivalence checking or the logic synthesis.

Furthermore, in the design supporting apparatus according to the present invention, it is possible for the user (LSI designer or circuit designer) to add and modify description forms as a knowledge base, and then to detect a desired description form. As a result, it is possible to add a new description form, which occurs a problem by a tool such as the test, the equivalence checking, the logic synthesis, or the like, and it is possible to delete a rule concerning a description form that has been already overcome. Therefore, a check specifying any one of the test, the equivalence checking, and the logic synthesis can be realized.

The present invention is not limited to the specifically disclosed embodiments, and variations and modifications may be made without departing from the scope of the present invention.

The present application is based on the Japanese Priority Application No. 2003-298291 filed on Aug. 22, 2003, the entire contents of which are hereby incorporated by reference.

What is claimed is:

1. A design supporting apparatus for checking hardware functional description of large-scale integrated circuit to determine that a portion of the hardware functional description renders it difficult to detect fault in said circuit through a logic built-in self-test of the large-scale integrated circuit, comprising:

an inputing part inputting functional description data at a register transfer level:

a syntactic analyzing part conducting a syntactic analysis of the functional description data and developing a parse tree;

a scanning and searching part scanning the parse tree developed by said syntactic analyzing part and searching for a description representing a comparison operator having multiple bits, and determining a location of said comparison operator in said functional description data; and an output part outputting a warning that a portion of the hardware functional description degrades test quality of the logic built-in self-rest, by indicating said location of said comparison operator in said functional description data.

2. The design supporting apparatus of claim 1, wherein said comparison operator includes at Least one of a set of functional description operators including equality operator, inequality operator, greater-than operator, greater-than-or-equal-to operator, less-than operator, and less-than-or-equal-to operator.

3. The design supporting apparatus of claim 1, wherein said parse tree stores operands and operators extracted from said functional description data.

4. The design supporting apparatus of claim 1, wherein said location, output by said output part, of said comparison operator in said functional description includes a file name and a line number.

5. The design supporting apparatus of claim 1, wherein said parse tree includes a plurality of node, and each node corresponding to a functional description operator stores an identifier of an operator type of said functional description operator.

6. A computer readable medium tangibly embodying a program of instructions executable by a computer to perform a method for checking hardware functional description of large-scale integrated circuit to determine that a portion of the hardware functional description renders it difficult to detect fault in said circuit through a logic built-in self-test of the large-scale integrated circuit, said method comprising:

inputting functional description data at a register transfer level;
  conducting a syntactic analysis of the functional description data and developing a parse tree;
  scanning the parse tree and searching for a description representing a comparison operator having multiple bits;
  determining a location of said comparison on operator in said functional description data; and
  outputting a warning that a portion of the hardware functional description degrades test quality of the logic built-in self-test of said large-scale integrated circuit, by indicating said location of said comparison operator in said functional description data.

7. The computer readable medium of claim 6, wherein said comparison operator includes at least one of a set of functional description operators including equality operator, inequality operator, greater-than operator, greater-than-or-equal-to operator, less-than operator, and less-than-or-equal-to operator.

8. The computer readable medium of claim 6. wherein said parse tree stores operands and operators extracted from said functional description data.

9. The computer readable medium of claim 6, wherein said location of said comparison operator in said functional description includes a file name and a line number.

10. The computer readable medium of claim 6, wherein said parse tree includes a plurality of node, and each node corresponding to a functional description operator stores an identifier of an operator type of said functional description operator.

* * * * *